(12) United States Patent
Mayer

(10) Patent No.: US 7,170,751 B2
(45) Date of Patent: Jan. 30, 2007

(54) PRINTED CIRCUIT BOARD RETAINING DEVICE

(75) Inventor: Mark J. Mayer, Sagamore Hills, OH (US)

(73) Assignee: GELcore LLC, Valley View, OH (US)

( * ) Notice: Subject to any disclaimer, the term of this patent is extended or adjusted under 35 U.S.C. 154(b) by 188 days.

(21) Appl. No.: 11/029,843

(22) Filed: Jan. 5, 2005

(65) Prior Publication Data

US 2006/0146502 A1    Jul. 6, 2006

(51) Int. Cl.
*H05K 7/20* (2006.01)
(52) U.S. Cl. .................. 361/719; 361/704; 257/718; 257/727; 174/16.3; 165/80.3
(58) Field of Classification Search ............. None
See application file for complete search history.

(56) References Cited

U.S. PATENT DOCUMENTS

| | | | | |
|---|---|---|---|---|
| 5,089,936 A | * | 2/1992 | Kojima et al. ............ 361/705 |
| 5,461,541 A | * | 10/1995 | Wentland et al. ........... 361/707 |
| 5,875,097 A | * | 2/1999 | Amaro et al. ............... 361/704 |
| 6,252,773 B1 | * | 6/2001 | Werner ....................... 361/704 |
| 6,714,414 B1 | * | 3/2004 | Dubovsky et al. .......... 361/704 |
| 6,791,183 B2 | * | 9/2004 | Kanelis ....................... 257/718 |
| 7,033,060 B2 | * | 4/2006 | Dubuc ......................... 362/600 |

* cited by examiner

*Primary Examiner*—Boris Chervinsky
(74) *Attorney, Agent, or Firm*—Fay, Sharpe, Fagan, Minnich & McKee, LLP

(57) ABSTRACT

A retaining device holds a PCB to a heat sink that has channels for receiving the retaining device. The retaining device includes a body having portions configured for receipt into the channels of the heat sink and moveable tabs and protuberances protruding away from a first surface of each moveable tab. A method for holding the PCB to the heat sink is disclosed. A lighting assembly that includes the retaining device is also disclosed.

19 Claims, 4 Drawing Sheets

PRINTED CIRCUIT BOARD RETAINING DEVICE

BACKGROUND OF THE INVENTION

Often times a heat sink is provided to dissipate heat generated by electrical components that are mounted to a printed circuit board ("PCB"). To maximize the amount of thermal energy transferred from the PCB to the heat sink, the surface area of the PCB in contact with the heat sink should be maximized. Because of surface imperfections of the two surfaces, better thermal transfer is achieved when pressure is applied to the PCB.

SUMMARY OF THE INVENTION

A cam holds a PCB to a heat sink that has channels for receiving the cam. The cam includes a body having portions configured for receipt into channels of the heat sink and moveable tabs having protuberances extending away from a surface of each moveable tab.

A method for holding a printed circuit board against a heat sink includes the following steps: facing a first surface of a PCB toward a first surface of a heat sink; placing a protuberance of a cam that comprises a moveable tab and the protuberance disposed on the tab in contact with a second surface of the printed circuit board; applying a force on the cam in a direction towards the PCB; moving the cam such that a portion of the cam is received into a channel of the heat sink; and removing the force from the cam, whereby the movable tab exerts a force on the printed circuit board.

A lighting assembly includes a PCB, an LED mounted to the PCB, a heat sink, and a cam. The heat sink includes a mounting surface contacting the PCB and a first channel spaced from the mounting surface. The cam includes a moveable tab and a protuberance disposed on the moveable tab that contacts the PCB. To fasten the PCB to the heat sink, a portion of the cam is received in the channel of the heat sink.

DETAILED DESCRIPTION OF THE INVENTION

Figure 1:
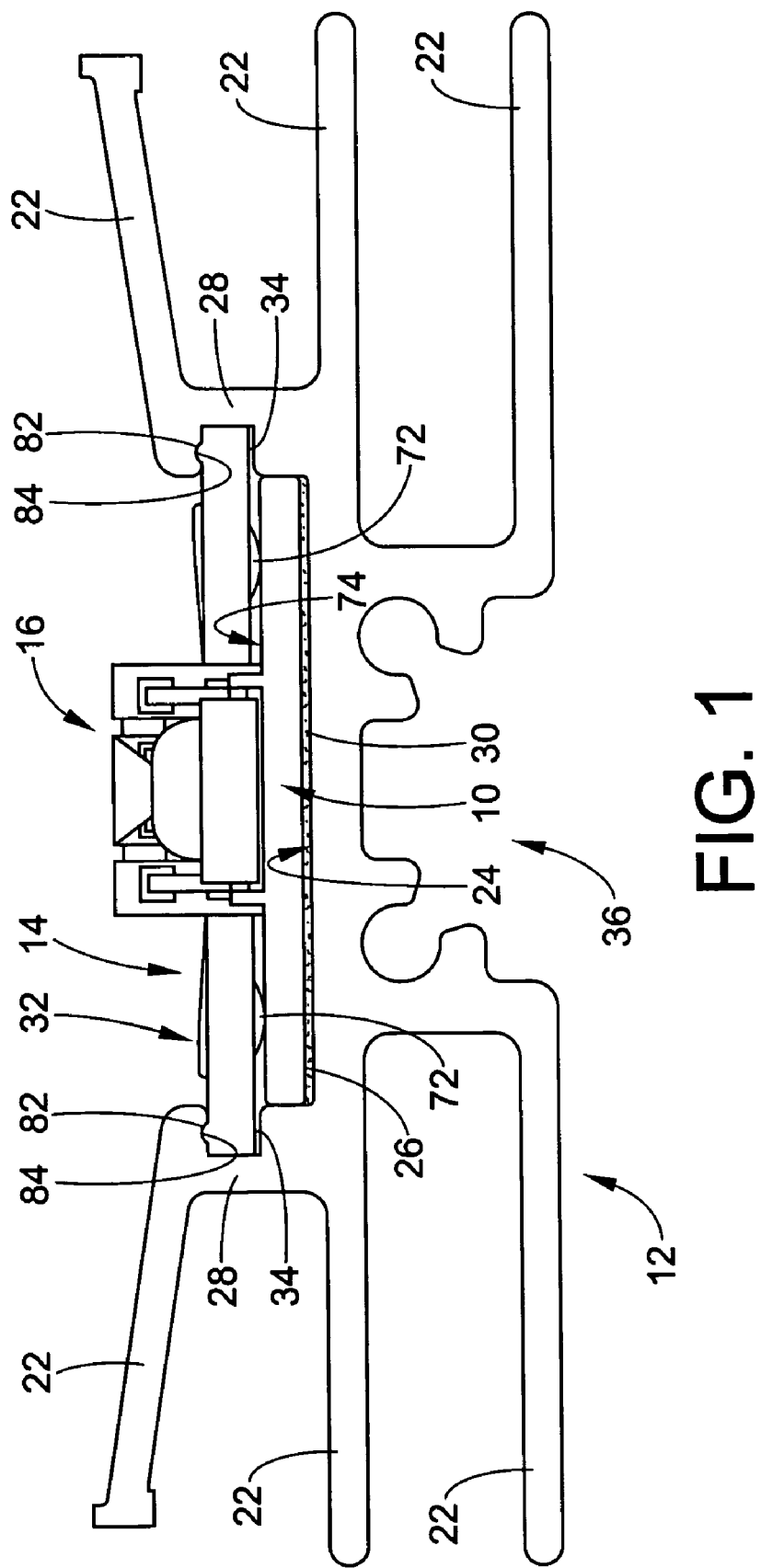
FIG. 1 is side view of a light assembly.

With reference to FIG. 1, a printed circuit board 10 mounts to a heat sink 12 using a fastening device, which will be referred to as a cam 14. In the depicted embodiment, the PCB 10 is a long rectangular aluminum clad PCB to which a plurality of LEDs 16 are mounted. The fastening device described below is not limited to retaining the PCB depicted, but can be used with other PCBs. Traces (not shown) interconnect the LEDs 16 and are attached to a power source (not shown). Even though LEDs are depicted as being mounted to the PCB, other electrical components can also mount to the PCB. The LEDs 16 generate heat that is transferred to the PCB 10 and ultimately transferred into the heat sink 12. The cam 14 works in conjunction with the configuration of the heat sink 12 to apply pressure to the PCB 10 to retain the PCB to the heat sink and to encourage greater surface area contact between the PCB and the heat sink.

The heat sink 12 is made of a heat conductive material, which in the depicted embodiment is an extruded aluminum. In the depicted embodiment, the heat sink is symmetric along a longitudinal axis 20 (FIG. 2) and includes a plurality of fins 22 that run parallel to the longitudinal axis to increase its surface area for more efficient heat dissipation. The heat sink 12 includes a mounting surface 24 that faces and/or contacts a lower, or first, surface 26 of the PCB 14. Two side walls 28 extend from the mounting surface 24 to define a channel 32 that runs along the longitudinal axis 20 in which the PCB 10 is disposed. As seen in FIG. 1, the fins 22 extend away from the side walls 28.

In the embodiment depicted, the side walls 28 are at least generally parallel to one another and spaced apart from one another a distance approximately equal to the width of the PCB 10. Each side wall 28 includes a cam receiving channel 34 running parallel to the longitudinal axis 20 of the heat sink. The cam receiving channels 34 are vertically spaced from the mounting surface 24 a distance approximately equal to the height of the PCB 10 and are configured to receive a portion of the cam 14. In the depicted embodiment, the cam receiving channels 34 run along the entire length of the heat sink 12; however, the channels 34 can be interrupted along the length of the heat sink.

In the depicted embodiment, the heat sink 12 also includes a mounting configuration 36 that allows the heat sink to attach to a support structure. One environment where this assembly can be located is inside a commercial refrigeration unit. Commercial refrigeration units typically include a plurality of lights mounted to a mullion that illuminate items stored in the unit. The mounting configuration 36 is adapted to allow for attachment of the heat sink 12 to such a mullion. Alternatively, the heat sink can include a mounting configuration adaptable for other environments.

The cam 14 holds the PCB 10 against the mating surface 24 of the heat sink 12. It is very difficult to manufacture surfaces that are truly flat. Typically, when two "flat" surfaces are brought in contact with one another, three points from the first "flat" surface, i.e. a truly flat plane, contact three points from the second "flat" surface. By applying pressure the PCB 10, more points that make up the lower surface 26 of the PCB 10 can contact more points that make up the mounting surface 24 of the heat sink 12. Having more points that are in contact with one another results in more thermal energy directly passing from the PCB 10 into the heat sink 12 because heat does not have to travel through air, which is not as conductive as the thermally conductive material of the heat sink. To further facilitate heat transfer between the PCB 10 and the heat sink 12, a compressible thermally conductive material 30, for example a tape having graphite, can be interposed between the lower surface 26 of the PCB 10 and the mounting surface 24 of the heat sink 12.

In the depicted embodiment, the cam 14 is a substantially planar body 50 made of plastic having opposing at least substantially planar surfaces: upper surface 52 and lower surface 54. The planar body 50 can have a generally American football-shape in plan view such that the planar body 50 is axially symmetric in both a longitudinal axis 58 and a transverse axis 62. The length of the planar body 50 is greater than its width.

Figure 3:
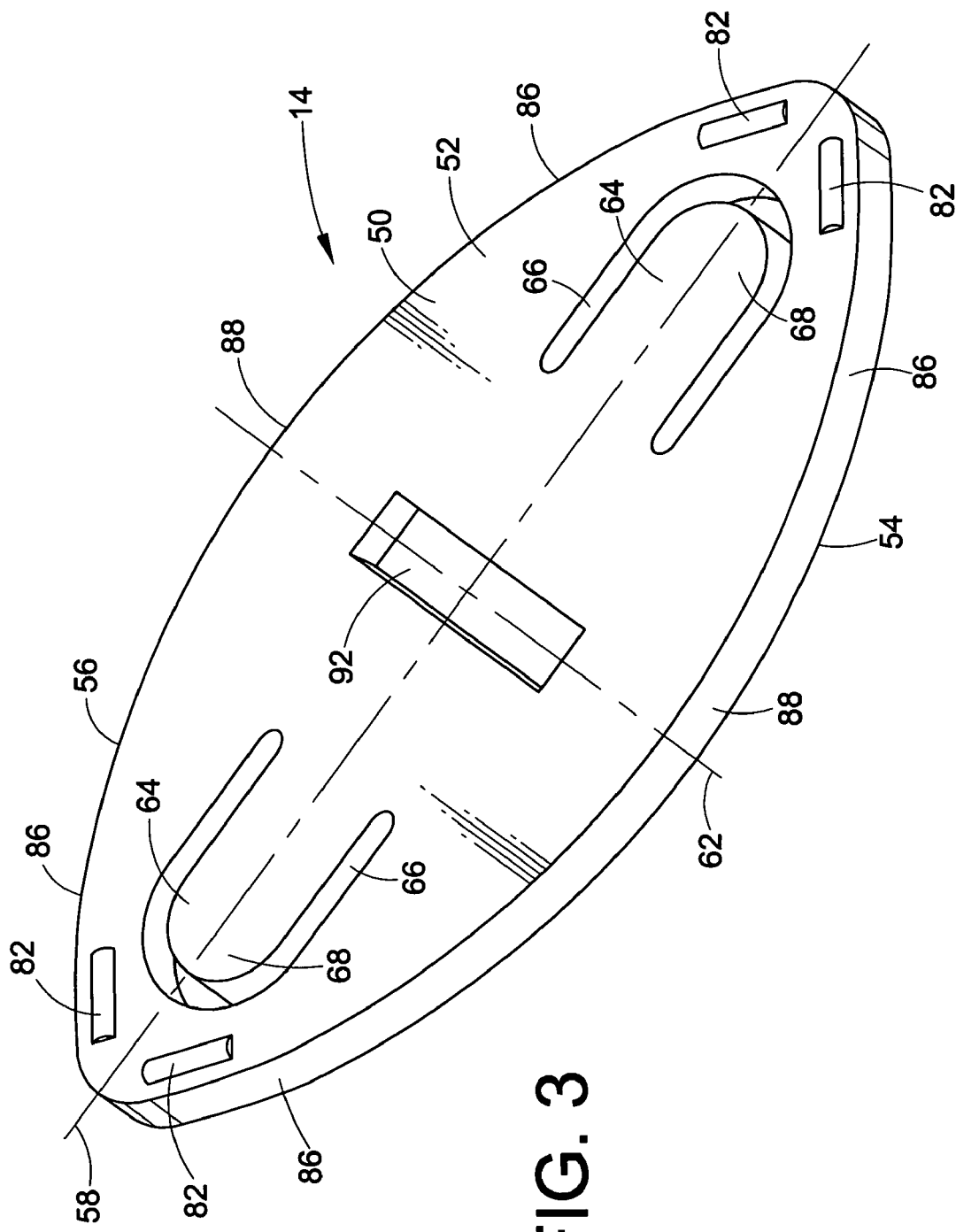
FIG. 3 is a first perspective view of a fastening device for use with the light assembly of FIG. 1.
Figure 4:
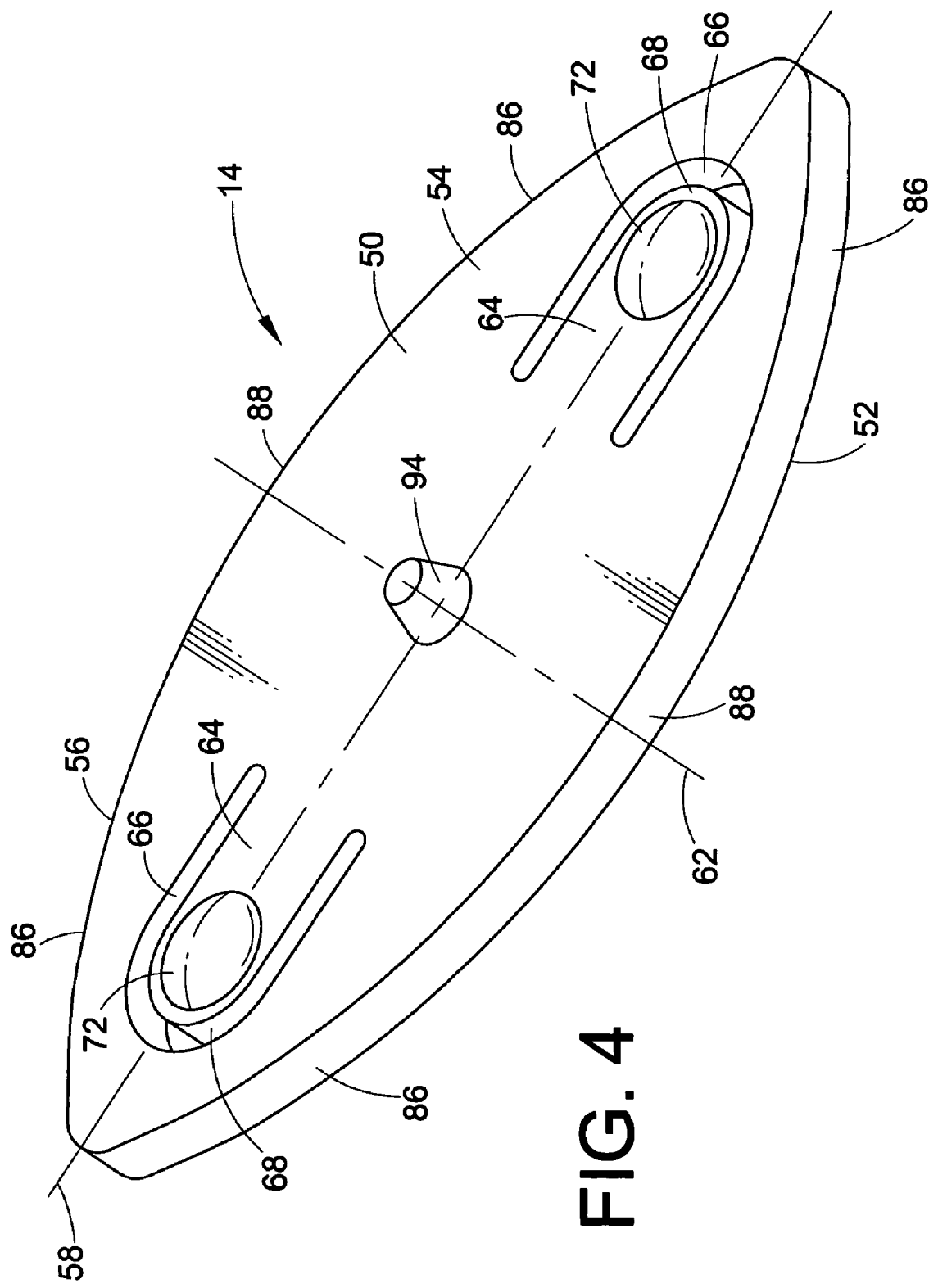
FIG. 4 is a second perspective view of the fastening device of FIG. 3.

As seen in the embodiment depicted in FIGS. 3 and 4, two tabs 64 that are integral with the cam body 50 are defined by U-shaped cut outs 66 that extend through the planar body 50.

The tabs are symmetrical along both the longitudinal axis 58 and the transverse axis 62, extending in opposite directions from the transverse axis 62. The tabs 64 are spaced inward from the peripheral edge 56 of the body 50 and a distal end 68 of each tab 64 is positioned near each longitudinal end of the body 50.

Protuberances 72 extend away from the lower surface 54 of each tab 64. The protuberances 72 are located near the distal end 68 of each tab 64 and extend away from the tab. In the depicted embodiment, the protuberances 72 are substantially dome-shaped, which limits the contact surface between the protuberance and an upper surface 74 of the PCB 10. The limited contact between the protuberances 72 and the upper surface 74 limits the amount of friction between the surfaces when the cam 14 is rotated and locked into place, which will be described in more detail below. The tabs 64 acting in concert with the protuberances 72 act as a sort of leaf spring when the cam 14 in locked into place.

With reference back to FIG. 1, the protuberances 72 allow the cam 14 to apply a force on the PCB 10 in a direction normal to the mating surface 24 of the heat sink 12. To affix the PCB 10 to the heat sink 12, the cam 14 is positioned on the upper surface 74 of the PCB 10 and a downward force, i.e. a force in a direction normal to the mounting surface 24, is applied to the cam 14. The downward force results in the tabs 64 flexing upward because of the protuberances 72. Then the cam 14 is rotated such that a portion of the peripheral edge 56 is received inside the cam receiving channels 34. At least the portion of the body 50 received in the cam receiving channels 34 has a thickness approximately equal to the cam receiving channel 34. With a portion of the body 50 being received in the cam receiving channels 34, the tabs 64 remain flexed upward. The upward flexing of the tabs 64 results in a downward force on the PCB 10. Since the tabs 64 are axially symmetric with respect to two axes, a balanced load is applied to the PCB 10. To increase the amount of pressure that is applied to the PCB 10 by the tabs 64, either the length of the tabs can be changed or the height of the protuberances 72 can be changed.

With reference back to FIG. 3, ridges 82 extend upwardly from the upper surface 52 of the body 50. The ridges 82 run substantially parallel to the portion of the peripheral edge 56 adjacent the ridges 82. Two ridges are provided near each longitudinal end of the body 50 so that the cam 14 can be rotated either in a clockwise or counterclockwise direction to engage the cam receiving channels 34 (FIG. 1). With reference back to FIG. 1, mating grooves 84 are formed in the cam receiving channels 34 for receiving the ridges 82. The ridges 82 are semi-cylindrical in configuration so that they can be easily urged into the mating grooves 84.

The body 50 of the cam 14 has an appropriate thickness or height and the peripheral edge 56 is appropriately shaped with respect to the dimensions of the channel 32 that receives the PCB 10 so that when the cam 14 is rotated into the cam receiving channels 34 the ridges 82 are aligned substantially parallel to a longitudinal axis 20 of the heat sink 12. Furthermore, in one embodiment the peripheral edge 56 follows generally linear paths near the longitudinal ends of the cam 14. Linear portions 86 of the peripheral edge 56 are interconnected by curved portions 88 nearer the transverse axis 62 of the body. The curved portions 88 have a generally large radius, which gives the body the substantially football-shaped configuration in plan view. The axially symmetric configuration allows the cam 14 to be rotated in either a clockwise or counterclockwise direction to engage the cam receiving channels 34. The linear portions 86 of the peripheral edge 56 provide a longer portion of the body 50 disposed in the cam receiving channel 34 to counteract the upward force applied on the cam 14 by the PCB 10. The cam body 50 can take alternative configurations; however, a symmetrical configuration can allow for either clockwise or counterclockwise rotation.

To facilitate rotation of the cam, a recess 92 configured to receive a screwdriver is centrally located on an upper surface 52 of the body 50. With reference to FIG. 4, a locating post 94 is centrally located on the lower surface 54 of the body 50. In one embodiment, a corresponding mating hole 98 (FIG. 2) is provided in the PCB 10 for receiving the locating post 94.

Figure 2:
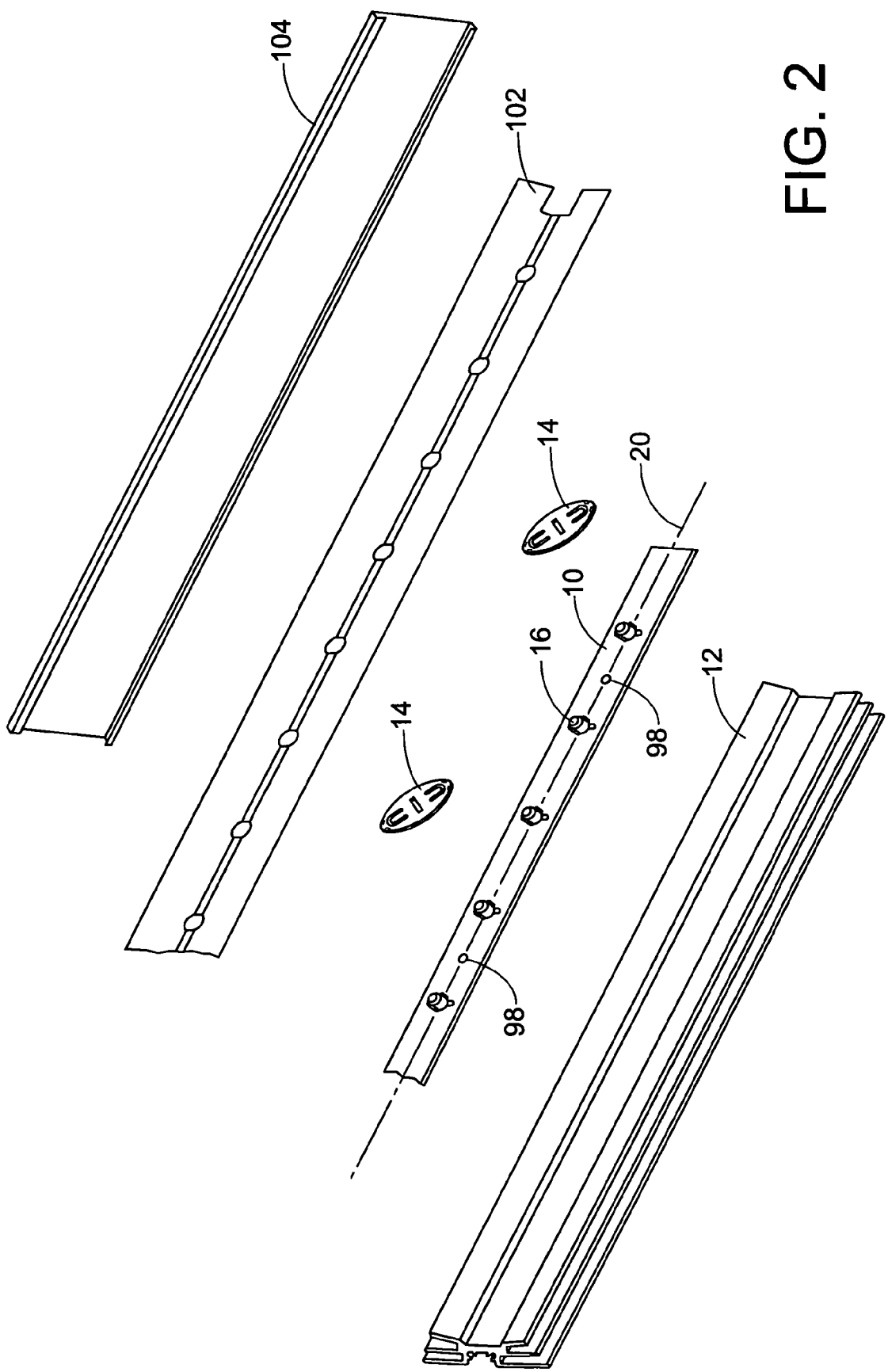
FIG. 2 is an exploded view of the light assembly of FIG. 1.

As mentioned above, the cam 14, or a plurality of cams, can be used in a lighting assembly, such as that depicted in FIGS. 1 and 2. As seen in FIG. 2, a reflector 102 and a protective cover 104 can also mount to the heat sink 12, or other structure (not shown) to make up the lighting assembly. The height of the planar body 50 of the cam is less than the height of the LED 16. Such a configuration provides a clear path for the light emitted from the LED 16. Even though a substantially planar body 50 for the cam 14 is depicted, other low profile configurations, e.g. nonplanar configurations, can be used where the cam 14 is used to retain a PCB 10 having light emitting electrical components mounted to it.

A retaining device for holding a PCB to a heat sink has been described with reference to certain embodiments. Many available alterations may occur to those skilled in the art upon reading the preceding detailed description. The invention is not intended to be limited solely to those embodiments described above, but is intended to include any device that comes within the scope of the appended claims.

The invention claimed is:

1. A cam for holding a printed circuit board to a heat sink that has channels for receiving the cam, the cam comprising a body having portions configured for receipt into a channel of a heat sink, a movable tab, and a protuberance extending away from a first surface of the movable tab.

2. The cam of claim 1, wherein the body is substantially planar having a substantially football-shaped periphery.

3. The cam of claim 1, wherein the body is axially symmetric.

4. The cam of claim 3, further comprising an additional movable tab wherein the tabs are spaced from one another and aligned along a central axis of the body.

5. The cam of claim 4, further comprising an additional protuberance extending away from a first surface of the additional tab, wherein the protuberances are located at or adjacent distal ends of the tabs.

6. The cam of claim 1, further comprising a ridge formed on a second surface adjacent a peripheral edge of the body.

7. The cam of claim 1, further comprising a central recess configured to receive a screwdriver.

8. A method for holding a printed circuit board against a heat sink comprising:
   facing a first surface of a printed circuit board toward a first surface of a heat sink;
   placing a protuberance of a cam that comprises a movable tab and the protuberance disposed on the tab in contact with a second surface of the printed circuit board, the second surface being opposite the first surface;
   applying a force on the cam in a direction towards the printed circuit board;
   moving the cam such that a portion of the cam is received into a channel of the heat sink; and removing the force from the cam, whereby the movable tab exerts a force on the printed circuit board.

9. The method of claim 8, further comprising:
placing a thermally conductive compressible material between the first surface of the printed circuit board and the first surface of the heat sink.

10. A light assembly comprising:
a printed circuit board;
an LED mounted to the printed circuit board;
a heat sink having a mounting surface contacting the printed circuit board and a first channel spaced from the mounting surface;
a cam including a first movable tab and a protuberance disposed on the first tab that is configured to contact the printed circuit board, the cam having a portion configured for receipt in the first channel of the heat sink.

11. The assembly of claim 10, wherein the cam includes a ridge disposed on a side of the cam opposite the protrusion.

12. The assembly of claim 11, wherein the ridge is generally parallel to an adjacent peripheral edge of the cam.

13. The assembly of claim 11, wherein the heat sink includes a mating groove that receives the ridge.

14. The assembly of claim 10, wherein the cam comprises a substantially planar body having a height that is about equal to a height of the channel.

15. The assembly of 10, wherein the cam has a height that is less than a height of the LED.

16. The assembly of claim 10, wherein the cam includes a central recess configured to receive a screwdriver.

17. The assembly of claim 10, wherein the first movable tab is defined by a U-shaped cut-out through the cam.

18. The assembly of claim 10, wherein the cam includes a locating post and the printed circuit board includes a mating hole that receives that locating post.

19. The assembly of claim 10, includes a substantially linear peripheral edge received in the first channel of the heat sink.

* * * * *